United States Patent
Tsuchiaki

(10) Patent No.: US 7,755,114 B2
(45) Date of Patent: Jul. 13, 2010

(54) SEMICONDUCTOR DEVICE AND MANUFACTURING METHOD THEREOF

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 11/337,506

(22) Filed: Jan. 24, 2006

(65) Prior Publication Data

US 2007/0018236 A1   Jan. 25, 2007

(30) Foreign Application Priority Data

Jul. 12, 2005   (JP) .............................. 2005-203314

(51) Int. Cl.
*H01L 29/02* (2006.01)

(52) U.S. Cl. .............................. 257/288; 257/E29.021; 257/E21.431

(58) Field of Classification Search .......... 257/E29.021, 257/E21.431, 288
See application file for complete search history.

(56) References Cited

U.S. PATENT DOCUMENTS

| | | | |
|---|---|---|---|
| 6,051,509 A | | 4/2000 | Tsuchiaki |
| 6,891,192 B2 * | | 5/2005 | Chen et al. ............ 257/E21.431 |
| 6,987,291 B2 * | | 1/2006 | Abbott et al. ......... 257/E29.021 |
| 7,018,901 B1 * | | 3/2006 | Thean et al. .......... 257/E21.438 |
| 7,037,795 B1 * | | 5/2006 | Barr et al. ............ 257/E21.431 |
| 7,052,964 B2 * | | 5/2006 | Yeo et al. .............. 257/E27.112 |
| 7,091,561 B2 * | | 8/2006 | Matsushita et al. .......... 257/347 |
| 7,211,458 B2 * | | 5/2007 | Ozturk et al. .......... 257/E21.43 |
| 7,238,580 B2 * | | 7/2007 | Orlowski et al. ..... 257/E21.431 |

OTHER PUBLICATIONS

Ng, Kwok K., Complete Guide to Semiconductor Devices, John Wiley & Sons, Inc., New York, © 2002, pp. 176-177.*
Irie et al., "In-Plane Mobility Anisotropy and Universality Under Uni-Axial Strains in n- and p-MOS Inversion Layers on (100), (110), and (111) Si", IEEE, 4 pages, (2004).
Ghani et al., "A 90nm High Volume Manufacturing Logic Technology Featuring Novel 45nm Gate Length Strained Silicon CMOS Transistors", IEEE, 3 pages, (2003).

* cited by examiner

*Primary Examiner*—W. David Coleman
*Assistant Examiner*—Sun M Kim
(74) *Attorney, Agent, or Firm*—Finnegan, Henderson, Farabow, Garrett & Dunner, L.L.P.

(57) ABSTRACT

A semiconductor device includes a semiconductor substrate, a monocrystalline channel region of a first conductivity type formed on the surface of the semiconductor substrate, a gate electrode formed on the channel region via a gate insulating film, a pair of source/drain electrodes of a second conductivity type provided on both sides of the gate electrode, metallic compound layers formed on the source/drain electrodes, stress application layers located under the respective source and drain electrodes and each having a crystal structure whose intrinsic lattice spacing is different from lattice spacing inherent in a substance constituting the source/drain electrodes, and first buried insulating regions disposed under the respective stress application layers.

14 Claims, 10 Drawing Sheets

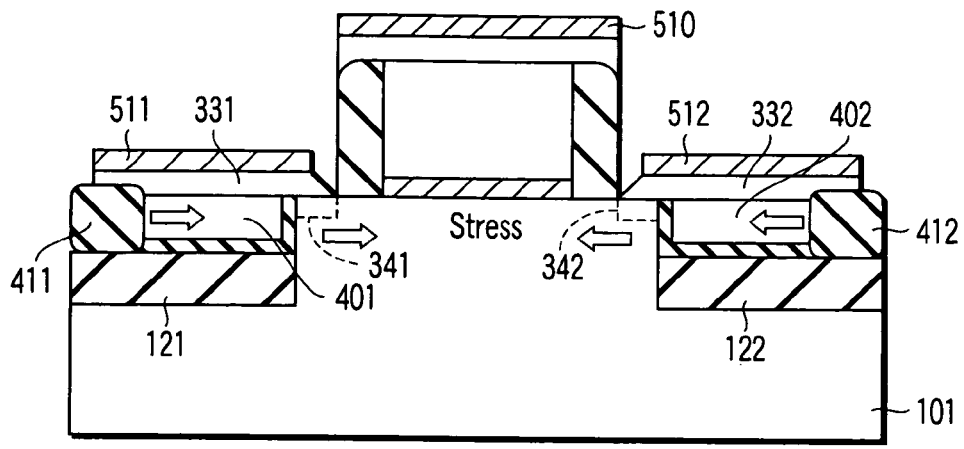
F I G. 1
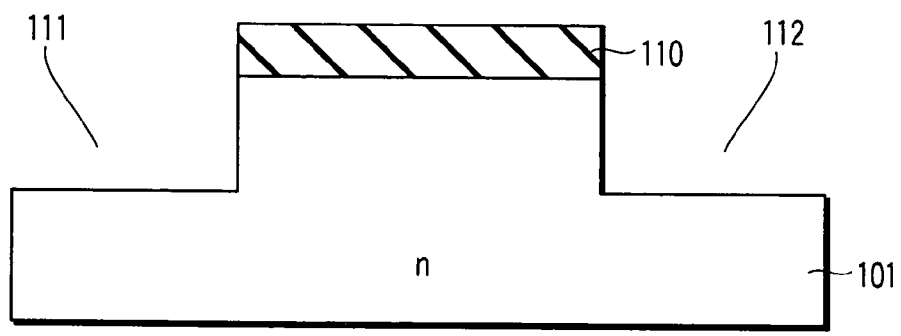
F I G. 2
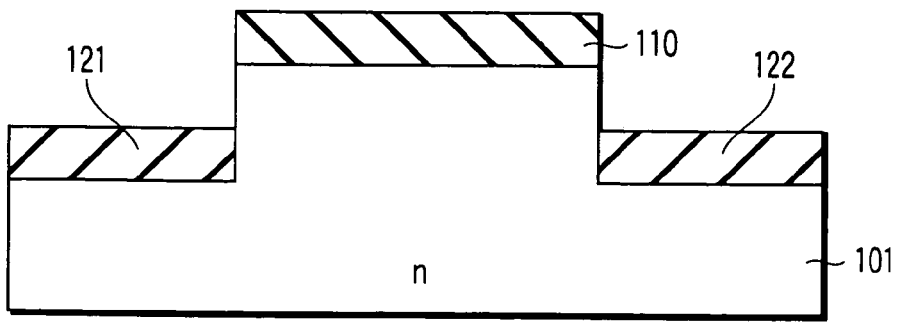
F I G. 3

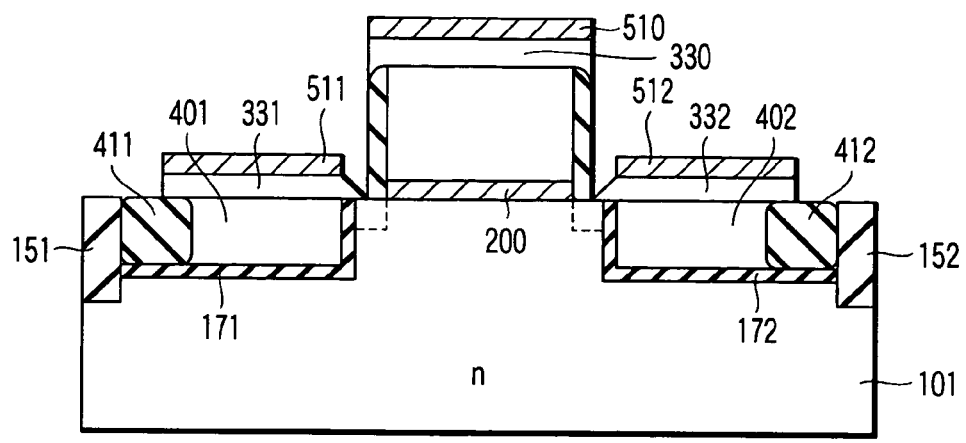
F I G. 16
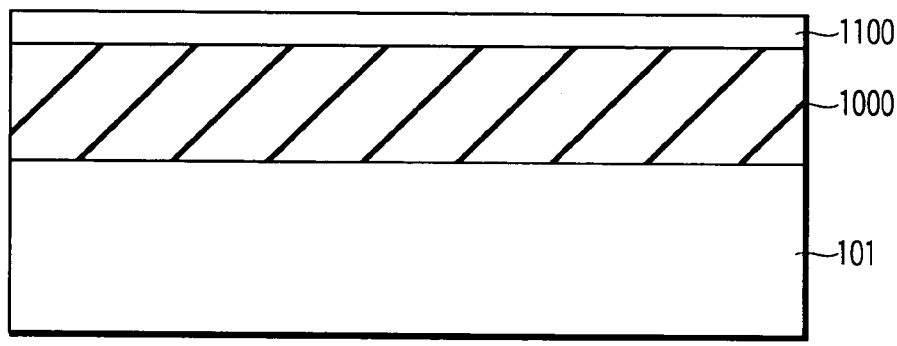
F I G. 17
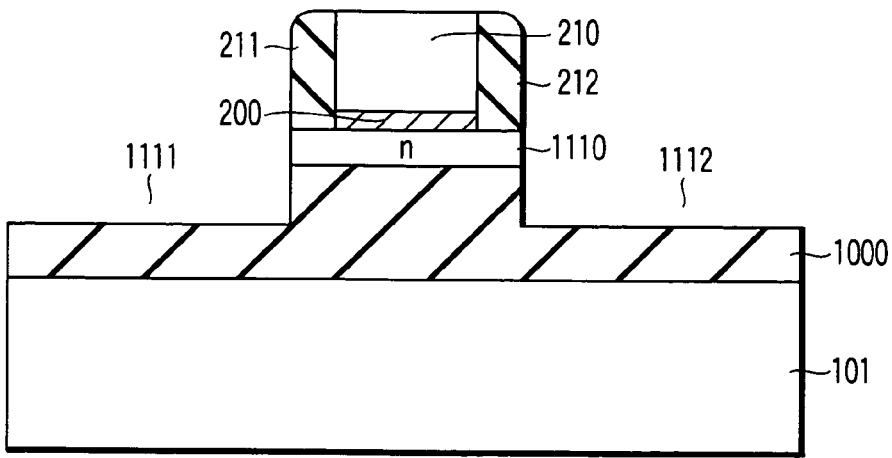
F I G. 18

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-203314, filed Jul. 12, 2005, the entire contents of which are incorporated herein by reference.

BACKGROUND OF THE INVENTION

1. Field of the Invention

The present invention relates to a semiconductor device, more particularly, a high-speed micro field effect transistor which retains mechanical stress in semiconductor regions constituting a channel and which comprises silicided source/drain electrodes, and also relates to a manufacturing method thereof.

2. Description of the Related Art

As evident in the prevalence of high-speed mobile communications, we are experiencing a remarkable transition towards an information-intensive society owing to the realization of sophisticated ultra-high-speed semiconductor devices. Naturally, demands for a higher speed operation, miniaturization of the physical dimensions, and large-scale as well as single-chip integration of the semiconductor devices are ever increasing. In order to meet these demands, however, realization of the higher speed operation and the miniaturization of MOS-type field effect transistors (hereinafter referred to as MOSFET's), which are the main components of these semiconductor devices, need to overcome various difficulties.

In order to achieve a higher speed operation of the MOSFET, one can take advantage of mobility enhancement by mechanical stress, a phenomenon in which electronic states in a conduction band and a valence band of a semiconductor are modulated and mobility of carriers (electrons and holes) is increased when mechanical stress is applied to a channel semiconductor portion (e.g., refer to H. Irie et al., IEDM Tech. Dig. pp. 225 to 228, 2004).

One may attempt to generate such mechanical stress in the channel portion after the completion of the MOSFET structure by depositing an additional insulating film having high internal stress over the entire MOSFET structure. Nonetheless, with this method, most of the stress of the film is to be applied to a gate electrode. Thus, it is not possible to effectively generate the required stress in the channel portion. Furthermore, eventually, electrical contacts to the source and drain regions must be established by forming contact holes through this stress-yielding insulating film over the source and drain regions.

If the sizes of the contact holes are comparable to the sizes of the source and drain regions (which is the very case of the small miniaturized MOSFET's), most of the deposited film containing the stress is to be removed from the MOSFET. Hence, practically, stress is not generated in the channel portion.

As shown in FIG. 28, such dissipation of the stress can be avoided by replacing the source/drain regions with a semiconductor material 1 (e.g., a eutectic of Si and Ge, hereinafter abbreviated as SiGe) which is different from the channel semiconductor (Si) and having a high internal stress (e.g., refer to T. Ghani et al., IEDM Tech. Dig. pp. 978 to 980, 2003). Because the stress-yielding semiconductor material replacing the source/drain regions comes to directly compress or expand the channel portion, stress is effectively generated in the channel portion.

In order to replace the source/drain regions with a stress-exerting semiconductor, first, the source/drain regions in the substrate semiconductor (Si) surface must be etched away to form recesses in the corresponding surface regions. Subsequently, a crystalline semiconductor material having a lattice constant different from that of the substrate semiconductor may be epitaxially grown to selectively fill up the aforementioned recesses. Naturally, since the source/drain electrodes are formed of a semiconductor of a kind different from the substrate semiconductor, junctions between the substrate semiconductor and the source/drain electrode semiconductor become so-called hetero-junctions 2 (i.e., junctions formed between different materials).

However, a hetero-junction between crystals having different lattice constants is prone to a generation of a great number of crystal defects 3 along the junction. Thus, a large junction leakage current comes to flow from the source/drain electrode to the substrate semiconductor through these defects. In order to suppress the junction leakage current associated with the hetero-junctions, it is necessary to entirely enclose these hetero-junctions by p-n junctions 4 by introducing a different type of conductive impurities from that in the substrate semiconductor. The dopants must be incorporated in wider and deeper regions, enveloping the heterogeneous source/drain semiconductor and extending into the substrate semiconductor, so that the hetero-junctions are completely contained within the doped regions and, therefore, electrically isolated from the substrate semiconductor by these p-n junctions formed between the doped regions and the substrate.

However, conductive impurities introduced in the vicinity of the hetero-junction full of crystal defects, are known to diffuse very rapidly due to the crystal defects (this is called transient enhanced diffusion). It entails that the depth of the p-n junction to envelope the hetero-junction becomes deeper than the intended depth. In addition, it is known that a conductive impurity such as As diffuses in SiGe at a high speed, and the depth of the p-n junction will become even deeper.

Once the p-n junctions of the source/drain regions deepen, the electric field at the source and drain electrodes starts to influence the electric potential around the center of the channel portion and, thus, comes to reduce the threshold voltage of the MOSFET (i.e., short channel effect). If the threshold voltage comes to differ from the intended value, the resulting unexpected device operation impairs the designed function of the entire circuit. Moreover, with the short channel effect, the threshold voltage comes to depend on the physical length of the gate electrode very sharply. Therefore, even a slight deviation in the gate length due to practically inevitable processing variation during the gate formation cannot be tolerated to achieve the intended characteristics of the device, which significantly compromises the manufacturability of the circuit.

The only way to avoid this devastating short channel effect is shallowing the pn-junction depth. Concordantly, the hetero-junctions and the stress-yielding semiconductor material, which must be entirely enveloped by the pn-junctions to suppress the leakage current, have to be also kept shallow and thin. Nonetheless, thinning of the stress-yielding semiconductor material constituting the hetero-junctions may invalidate the very purpose for the introduction of the material, because the thin "stressor" (i.e., stress-yielding semiconductor material) cannot simply generate sufficient stress in the channel portion to increase the carrier mobility, dashing the initial intention for obtaining high-speed operation of the devices.

In addition, the conductivity of the source/drain electrodes causes yet another intractable problem when the heterogeneous stressor is employed as a source/drain electrode material. First, in order to ensure high-speed operation of the device, the electrical resistance of the source/drain electrode must be kept low so that high-speed transmission of an electrical signal along the channel is not retarded in the source/drain electrodes. The reduction of the electrical resistance of the source/drain becomes especially critical when the source/drain electrodes are force to be thin to avoid the short channel effect as explained above. Conventionally, the reduction of the electrical resistance of the source/drain is achieved by forming a compound between a metallic material and the source/drain-constituting semiconductor by selectively reacting the upper surfaces of the source/drain region with a metal.

One of the metal suitable for this purpose is Ni, which does not show an increase in electrical resistance when it is formed in a thin-line shape (thin-line effects) and, thus, is applicable to a miniaturized LSI. However, when Ni reacts with a semiconductor material other than Si, for example, SiGe, the reaction is unstable and does not proceed uniformly. The resultant interface between the source/drain-constituting semiconductor material and the metallic compound 5 thereon becomes very rough. The high asperity of the interface leads to a stochastic formation of spike-shaped deep protrusions of the metallic compound 6, penetrating through the "stressor" (i.e., stress-yielding and source/drain-constituting semiconductor material) and even reaching the underlying semiconductor beyond the deeper p-n junction. Needless to say, such protrusions generate significant junction leakage. Moreover, the non-uniformly-formed metallic compound may well agglomerate into island shapes or break off into disconnected patches so that the electrical resistance increases precipitously.

In addition, it is known that a compound of Ni and SiGe reduces the internal stress possessed by SiGe. Therefore, even if the stress-yielding semiconductor is employed as a source/drain material to generate stress, sufficient stress cannot be generated in the channel portion, and the mobility is not increased.

Now it becomes clear that, when a stress-yielding semiconductor with high internal stress is employed as a source/drain material to generate stress in the channel portion and, thus, enhance the mobility of a MOSFET, generation of sufficient stress, avoidance of the short channel effect, and suppression of the junction leakage cannot be realized simultaneously. In addition, it becomes difficult to simultaneously achieve reduction of the electrical resistance of the source/drain electrodes, suppression of the junction leakage and retention of stress.

Therefore, an ultra-high-speed micro MOSFET in which both the short channel effect and the junction leakage are suppressed, resistance is reduced in the source/drain electrode, and the mobility is increased by the stress imposed on the channel portion, is much desired and there has been a need to establish a practical manufacturing method thereof.

BRIEF SUMMARY OF THE INVENTION

According to a first aspect of the invention, there is provided a semiconductor device which comprises:

a semiconductor substrate;

a monocrystalline channel region of a first conductivity type formed on the surface of the semiconductor substrate;

a gate electrode formed on the channel region via a gate insulating film;

a pair of source/drain electrodes of a second conductivity type provided on both sides of the gate electrode and having a monocrystalline or polycrystalline structure;

metallic compound layers formed on the source/drain electrodes;

stress application layers located under the respective source and drain electrodes and each having a crystal structure whose intrinsic lattice spacing is different from lattice spacing inherent in a substance constituting the source/drain electrodes; and first buried insulating regions disposed under the respective stress application layers.

According to a second aspect of the invention, there is provided a method of manufacturing a semiconductor device which comprises:

forming a gate electrode with sidewall insulating films on a semiconductor substrate via a gate insulating film;

forming a pair of recesses into the semiconductor substrate on both sides of the gate electrode;

forming liner insulating layers insoluble in an HF solution at bottoms and sides of the pair of recesses;

filling the pair of recesses with sacrificial insulating layers soluble in the HF solution via the liner insulating layers;

forming an amorphous silicon layer on the semiconductor substrate after the filling of the sacrificial insulating layers;

subjecting the amorphous silicon layer to a thermal treatment and converting the amorphous silicon layer on the semiconductor substrate into monocrystalline or polycrystalline source/drain electrodes;

removing by the HF solution the sacrificial insulating layers soluble in the HF solution to form gaps directly under the source/drain electrodes;

filling the gaps with a crystalline substance having an intrinsic lattice spacing different from that of the semiconductor substrate; and forming metallic compound layers on the source/drain electrodes.

According to a third aspect of the invention, there is provided a method of manufacturing a semiconductor device which comprises:

preparing an SOI substrate in which a semiconductor layer is formed on a substrate via a buried insulating layer;

forming a gate electrode with sidewall insulating films on the SOI substrate via a gate insulating film;

forming an amorphous silicon layer over the SOI substrate;

subjecting the amorphous silicon layer to a thermal treatment and converting the amorphous silicon layer into monocrystalline or polycrystalline source/drain electrodes;

selectively removing a part of the buried insulating layer existing under the source/drain electrodes to form gaps;

filling the gaps with a crystalline substance having an intrinsic lattice spacing different from that of the semiconductor layer; and forming metallic compound layers on the source/drain electrodes.

BRIEF DESCRIPTION OF THE SEVERAL VIEWS OF THE DRAWING

FIG. 1 is a sectional view of a MOSFET showing a basic configuration of an embodiment of the present invention;

FIGS. 2 to 10 are sectional views for stepwise explanation of a process of manufacturing the MOSFET according to a first embodiment;

FIGS. 11 to 16 are sectional views for stepwise explanation of a process of manufacturing a MOSFET according to a second embodiment;

FIGS. 17 to 22 are sectional views for stepwise explanation of a process of manufacturing a MOSFET according to a third embodiment;

DETAILED DESCRIPTION OF THE INVENTION

Figure 4:
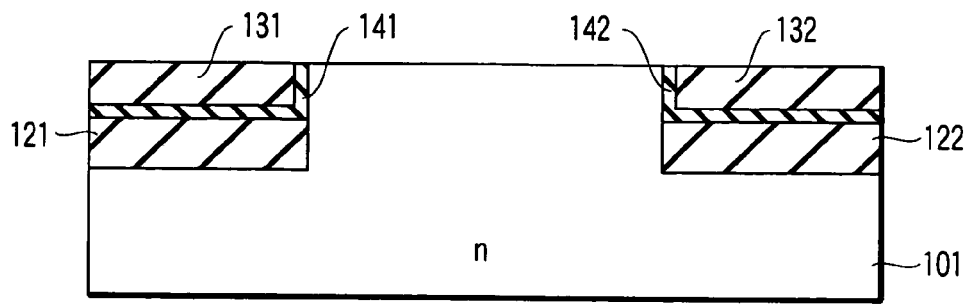

According to embodiments of the present invention hereinafter described, since a buried stress-producing layer (termed as "stressor layer" from now on) is disposed adjacently to a channel portion, its stress can be effectively applied to the channel portion, and channel mobility can be efficiently improved.

Furthermore, since the stressor layer has its sides and bottom covered with a liner insulating film, leakage current to a substrate and a channel region is completely prevented. Moreover, because it is not necessary to form a p-n junction around the stressor layer, the short channel effect is avoided.

Moreover, since compound formation reaction between a metallic material and a semiconductor material (which will be expressed as "silicidation" for simplicity hereafter) can be made to proceed only in upper silicon layers, while the buried stressor layer is saved from the silicidation, the bottom interfaces of the metallic compound layers (which will be called below as "silicide layers" in short) become smooth and flat, and, therefore, stochastic emergence of spike-shaped deep protrusion and associated severe junction leakage are prevented. In addition, the even and uniform silicide layer is spared from agglomeration into disconnected patches and accompanying increase in electrical resistance and, thus, a low resistance of source/drain electrodes can be maintained.

In a semiconductor device of the present invention, the carrier mobility is improved by the stress generated in the channel portion, and a stressor layer is formed over a device isolation region, so that generation of a junction leakage current is avoided, and, at the same time, a shallow junction position is maintained, thereby preventing the short channel effect. Further, the source/drain electrodes are made to partially extend over the device isolation regions to reduce their electric capacitive couplings with the substrate. In addition, thanks to the even and uniform silicide layer obtained by the silicidation of the silicon layer, the resistance of the source/drain electrode is effectively reduced. This provides a simple manufacturing process of a SALICIDED (i.e., silicide layers being formed on the source/drain and gate electrodes in a self-aligned manner) p-MOSFET with an elevated source/drain structure.

An exemplary configuration of the MOSFET according to the embodiments of the present invention comprises substances 401, 402 having internal stress (stressor layers) between silicon layers 331, 332 selectively formed on the source/drain regions and a semiconductor substrate 101, as shown in a sectional view of FIG. 1. Thus, either compressive or tensile stress is directly and efficiently applied to the channel portion at will and, as a result, the channel mobility can be readily modulated.

Moreover, bottoms of the stressor layers 401, 402 are insulated from the semiconductor substrate 101 by buried insulating regions 121, 122, thereby cutting off the leakage current path from the source/drain electrodes to the substrate semiconductor.

Furthermore, the bottoms of the stressor layers 401, 402 are insulated from the semiconductor substrate 101 by the buried insulating regions 121, 122, such that conductive impurities are prevented from diffusing through the stressor layers 401, 402, into the semiconductor substrate 101. Therefore, shallow junction positions (extensions) 341, 342 can be maintained, thereby making it possible to avoid the short channel effect.

In addition, since the silicidation reaction takes place only in the silicon layers selectively formed on the source/drain regions, uniform silicide layers 511, 512 are formed, the sporadic formation of wedge-like silicide protrusion is avoided, and the generation of the junction leakage current is suppressed. Moreover, an increase in the electrical resistance due to the silicide layer's partial breakage into disconnected patterns is prevented, and lower resistance of the source/drain electrodes can be attained.

At the same time, since the silicide layers 511, 512 are formed additionally on the top of the stressor layers 401, 402 and disposed at a distance from the channel region, an influence of the silicidation on the channel stress is substantially abated. Consequently, without losing the channel stress, the lower resistance of the source/drain electrodes can be realized while improving the channel mobility.

Furthermore, the buried insulating regions 121, 122 are provided under the source/drain electrodes, such that junction leakage can be prevented even with a stochastic protrusion of the silicide layer and/or uncontrollable infiltration and diffusion of metal atoms into the stressor layers.

Moreover, since the buried insulating regions 121, 122 under the source/drain electrodes serve as device isolation insulators, the electric capacitance between the source/drain electrode and the substrate semiconductor decreases, and a high-speed device operation can be accomplished.

Furthermore, the stressor layers 401, 402 can be partially oxidized to form sealing insulating layers 411, 412. By controlling the volumetric expansion associated with the oxidation and formation of the sealing layer, it is made possible to finely adjust the stress generated in the channel portion. As a result, the mobility of the channel can be modulated at will.

Still further, when crystalline stressor layers 401, 402 are epitaxially grown in the silicon layers 331, 332 which are selectively formed over the source/drain regions, by changing composition of the stressor layers, their intrinsic stress can be readily modified, and the stress to be applied to the channel can be controlled. As a result, the mobility of the channel can be freely modulated. In addition, the channel stress is made to be insusceptible to the formation of electrical contacts to the top of the silicide layers, because the stressor layers 401, 402 are completely buried in the substrate.

The embodiments of the present invention will be described below referring to the drawings.

First Embodiment

FIG. 1 shows an exemplary configuration of a semiconductor device according to an embodiment of the present invention. Although, in practice, plural MOSFETs are to be formed adjacently on a semiconductor substrate, FIG. 1 shows only one of the MOSFETs. In a first embodiment, a method of manufacturing the semiconductor device of FIG. 1 will be described referring to FIGS. 2 to 16.

First, as shown in FIG. 2, an insulating film, for example, a silicon nitride film 110, is formed on a region of a silicon semiconductor substrate 101 by a known technique such as a chemical vapor deposition (CVD) method, a lithographic process, and a reactive ion etching (RIE) technique. Using this film as a mask, shallow trenches 111, 112 are etched into the substrate by the RIE or the like. The n-type conductive impurities are introduced into the silicon semiconductor substrate.

Subsequently, as shown in FIG. 3, for example, silicon oxide films 121, 122 are formed as buried insulating layers at the bottom of the shallow isolation trenches 111, 112. The thicknesses of the silicon oxide films 121, 122 is adjusted so that the semiconductor substrate at the bottom of the shallow trenches 111, 112 is not driven into an inversion even if operating voltages are applied on the these layers.

The silicon oxide films 121, 122 can be formed in an effective method of the known technique. For example, an oxidation-resistant insulating film such as a silicon nitride film may be formed on the sidewalls of the shallow trenches. With the sidewalls being protected, the bottom planes can be selectively oxidized to form the buried insulating layers. Alternatively, the oxide film may be deposited to completely fill up the shallow trenches by the CVD method or the like. Then the oxide film may be etched back from above.

Next, on the top of such a structure, hydrofluoric acid (HF) resistant insulating films, for example, silicon nitride liners 141, 142 are deposited. Then, over the liners, for example, silicon oxide films 131, 132 are formed as sacrificial insulating layers by a known technique such as the CVD method and a chemical mechanical polishing (CMP) method to completely fill up the shallow trenches 111, 112. Naturally, the silicon nitride films 141, 142 exist as liner insulating layers at the bottoms and sides of the silicon oxide films 131, 132. The silicon nitride film 110 is removed, and a structure shown in FIG. 4 is realized.

Figure 5:
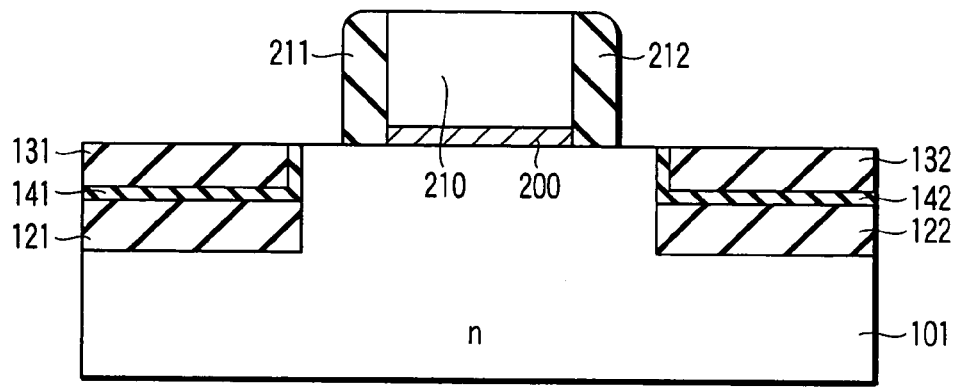

Furthermore, as shown in FIG. 5, for example, a gate insulator 200 made of, for example, a silicon oxynitride film, a gate electrode 210 made of, for example, polysilicon, and gate sidewalls 211, 212 made of, for example, silicon nitride films are formed by an effective method of a known technique such as a thermal nitridation method, the CVD method, and the RIE method.

Figure 6:
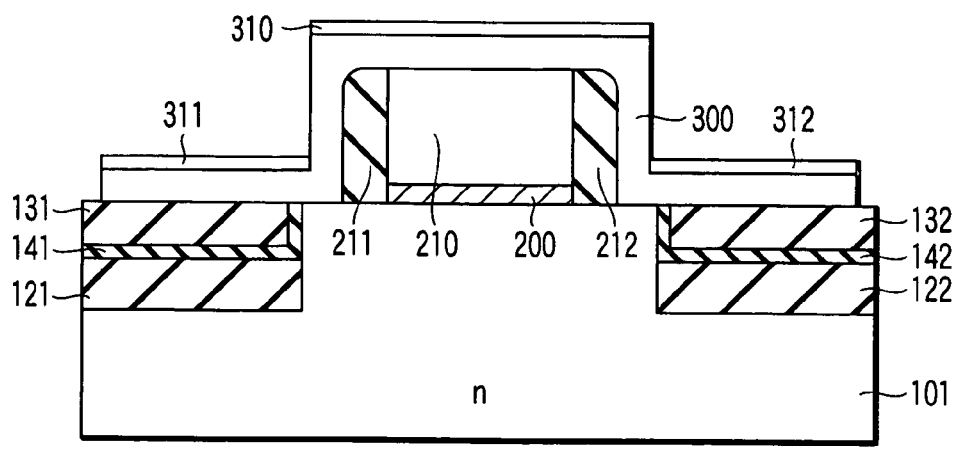

Subsequently, as shown in FIG. 6, an amorphous silicon layer 300 is uniformly and conformaly deposited over the exterior surfaces of the above substrate. This amorphous silicon layer 300 is deposited within the scope of the known technique, and can be easily formed by using, for example, $SiH_4$ gas at 0.2 Torr and at 400° C. Of course, $B_2H_6$ or the like may be added to the feeding $SiH_4$ gas to dope the amorphous silicon layer with a p-type impurity at this stage. Since this amorphous silicon layer is to be used as elevated source/drain electrodes of the MOSFET, part of the amorphous silicon layer deposited on the isolation regions is then removed by a lithographic method, the RIE method or the like.

Subsequently, this structure is exposed in a carbon-containing plasma. The carbon from the plasma impinges vertically on the structure and is selectively introduced onto horizontal surfaces of the amorphous silicon layer 300. Thus, carbon-containing silicon layers 310, 311, 312 are formed. The carbon-containing plasma can be produced by an effective method within the known technique. Anything capable of supplying carbon into the plasma can serve as a supply source of carbon. For example, carbon-containing plasma can be produced by supplying a gas such as $CF_4$, $CHF_3$, CCl or $CH_4$ into the plasma.

Generally, plasma has a positive potential with respect to the surroundings to maintain its plasma state. As a result, electric fields from the plasma develop along the normal directions of the surrounding surfaces so that positively charged particles from the plasma impinge vertically on the surrounding substances. Thus, positively charged carbon particles in the plasma vertically collide with the horizontal surface of the amorphous silicon layer 300. On the other hand, the vertical surfaces are spared from the vertical carbon influx.

Since particles from RIE plasma are usually accelerated with less than 1 KV, thickness of this carbon-containing silicon layer remains less than several nm. A carbon content of the carbon-containing silicon layer may be 1 atomic % or more.

Figure 7:
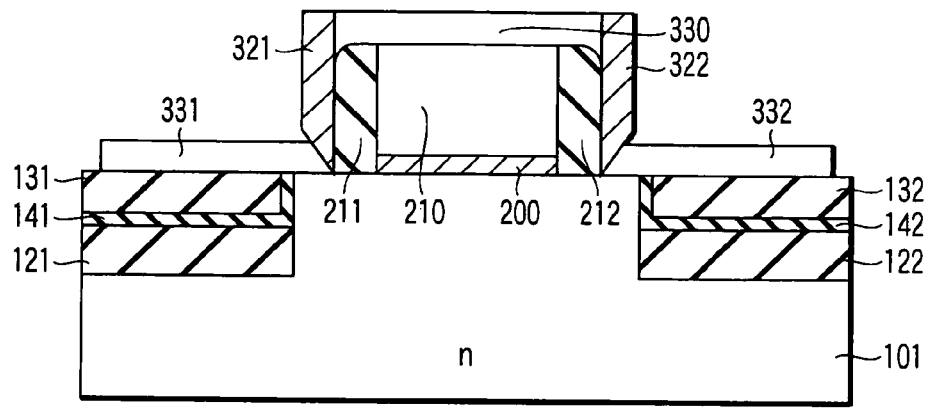

As disclosed in U.S. Pat. No. 6,051,509, the carbon-containing silicon layers are resistive against thermal oxidation. Thus, by thermally oxidizing the obtained structure using the carbon-containing silicon layers 310, 311, 312 as anti-oxidation masks, vertical surfaces are preferentially oxidized into oxide films 321, 322, resulting in a structure as shown in FIG. 7.

During the thermal oxidation, crystallization of the source/drain constituting amorphous silicon layers, which have direct contacts with the crystalline substrate, also takes place. Since the crystallinity of the substrate at the contact points serve as a seed for the crystallization, lateral epitaxial-growth of the amorphous silicon layers proceeds to realize monocrystalline source/drain silicon electrodes 331, 332. On the other hand, the amorphous silicon layer on the gate electrode turns into a polycrystalline silicon layer 330. Needless to say, the thermal processing for the epitaxial-growth can be performed independently before the oxidation step. Thin oxide films formed on the silicon layers 330, 331, 332, and the carbon-containing silicon layers 310, 311, 312 can be removed by an RIE treatment for a short time.

It should be noted that monocrystalline elevated source/drain electrodes having a uniform thickness are successfully realized here, which is otherwise very difficult to obtain. For example, a similar structure may be realized with a selective epitaxial method. However, selective growth is very sensitive to the surface state of the substrate. Therefore, the thickness of silicon to be grown varies depending on the roughness and crystal structure of the substrate surface. Moreover, the quality of the film (presence or absence of crystal defects) also depends on the surface state of the substrate. Once the thickness of the elevated source/drain electrodes become non-uniform, a series of problems arises. For example, the optimum thickness of a silicide layer to be formed thereon cannot be uniquely determined. Unlike the selective epitaxial growth, in the present embodiment, uniform amorphous silicon layers obtained by the CVD method are utilized for the following lateral epitaxial-growth, and therefore, uniform thickness of the elevated source/drain electrodes can be maintained.

Subsequently, such a structure is dipped in an HF solution, and the sacrificial insulating layers 131, 132 in the upper half portions of the isolation regions, which are the silicon oxide films, as well as the silicon oxide films 321, 322 on the gate sidewalls, are removed. On the other hand, the silicon oxide films 121, 122 formed at the lower half of the isolation regions stay intact thanks to the HF-resistant silicon nitride film liners 141, 142 disposed over them. Thus, as shown in FIG. 8, the far ends from the gate electrode of the source/drain monocrystalline silicon electrodes 331, 332 come to be suspended in midair over the isolation regions extending like wings.

At this stage, p-type impurities may be introduced into the monocrystalline silicon electrodes 331, 332 by using a known technique such as ion implantation. Subsequent annealing can diffuse the impurities from the monocrystalline silicon electrodes through the contacted regions into the substrate, to form source/drain extensions 341, 342 at both ends of the gate electrode. It is to be noted here that, except the source/drain extensions, impurities cannot diffuse downward directly into the substrate because the bottoms of the electrodes are hollow. Of course, the source/drain extensions can be formed prior to the ion implantation using the gate electrode as a mask when the gate electrode is formed.

Figure 8:
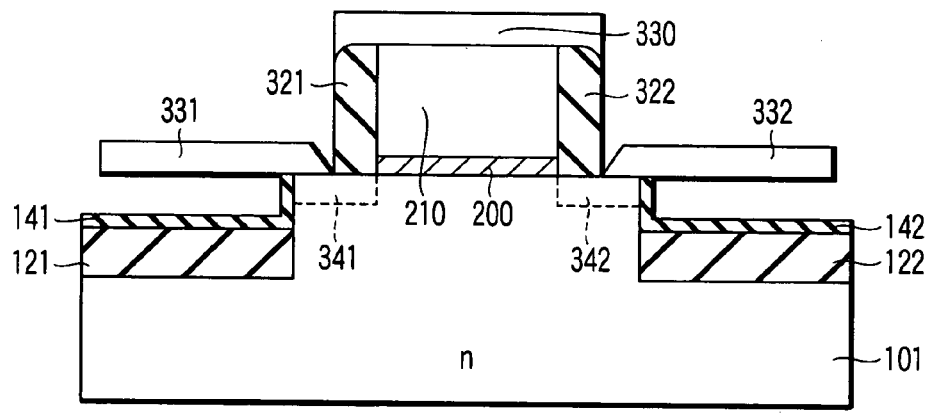
Figure 9:
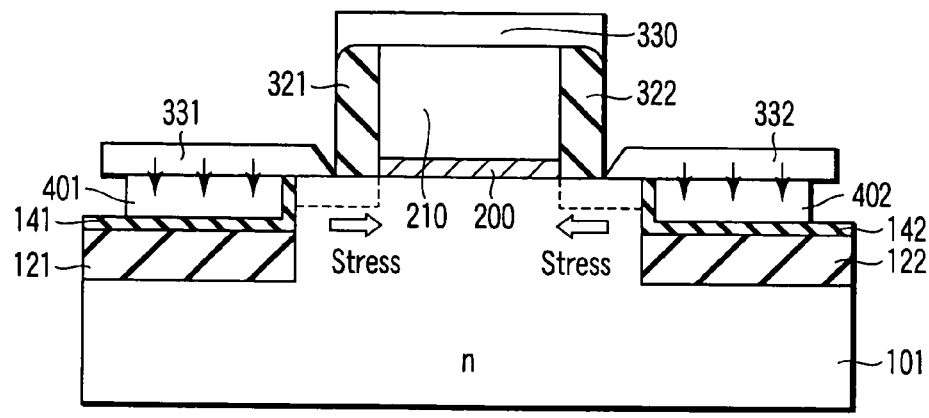

Next, for example, an amorphous SiGe layer containing 50% of Ge is deposited on a structure of FIG. 8 using the CVD method or the like. This amorphous SiGe layer can easily be deposited by using $SiH_4$ gas and $GeH_4$ gas, for example, at 300 Torr and at 500° C. The SiGe layer not only formed over the silicon electrodes 331, 332 but it also deposits conformally inside the gaps between the silicon electrodes 331, 332 and the silicon oxide films 121, 122 below to finally fill up the gaps. Subsequently, the SiGe layer formed over the exterior surface of the structure can be easily removed by immersion in, for example, a mixed solution of sulphuric acid and hydrogen peroxide solution. However, the SiGe layers 401, 402 filling the gaps survive the wet etching because their upper parts are protected by the source/drain monocrystalline silicon electrodes 331, 332. As a result, the structure shown in FIG. 9 is realized. Here, it should be noted that the sides and bottoms of the SiGe layers 401, 402 touch the silicon nitride film liners 141, 142, while their tops are in direct contact the monocrystalline silicon electrodes 331, 332.

Annealing this structure, for example, at 550° C. prompts epitaxial growth of the SiGe layers 401, 402 using the lattice arrangement of the source/drain monocrystalline silicon electrodes 331, 332 as a reference (i.e., seed) and thus turns them into monocrystalline. However, Ge atoms are larger than Si atoms. Accordingly, the intrinsic (i.e., stress-free) lattice spacing of the SiGe layer is naturally larger than the lattice spacing of monocrystalline Si. Therefore, when the SiGe is forced to crystallize in reference to the smaller Si lattice spacing, strong internal stress must be generated in the SiGe layers 401, 402. As a reaction, the resulting internal stress then pushes or pulls the surrounding substances depending on the type of the internal stress. Obviously, the gap-filling SiGe layers 401, 402 have a compressive stress. Therefore, they push the adjacent channel to generate compressive stress in the channel portion.

It is known that when a compressive stress is applied to the channel portion, the mobility of holes increases (e.g., refer to H. Irie et al., IEDM Tech. Dig. pp. 225 to 228, 2004). Therefore, a p-MOSFET with a compressed channel can operate at a higher speed.

It is added here that the SiGe layers 401, 402 can also be formed by epitaxially growing them directly on the source/drain monocrystalline silicon electrodes 331, 332 without going through the deposition of the amorphous layer.

It is further mentioned here that in order to generate stress in such buried SiGe layers 401, 402 which have no direct contact with the substrate, it is imperative that the crystalline silicon electrodes 331, 332 exist thereon as a seeds of the epitaxial growth. If such upper crystalline silicon electrodes 331, 332 do not exist (i.e., without any obvious reference), the SiGe layers 401, 402 freely and randomly crystallize into its intrinsic lattice structure. This un-constrained crystal growth does not generate stress in them. Only when the SiGe layers are forced to epitaxially grow in reference to smaller lattice constant of the upper crystalline silicon electrodes, an intended internal stress is generated therein.

Moreover, by adjusting the composition of a substance to be grown epitaxially (i.e., by tailoring its lattice constant), the stress to be generated can be finely tuned.

It should be also noted that, since the buried stressor SiGe layers 401, 402 are disposed directly adjacent to the channel portion, their stress can be effectively applied to the channel portion.

Furthermore, since the buried stressor SiGe layers 401, 402 have their sides and bottoms covered with the insulating silicon nitride film liners 141, 142, a leakage current to the substrate or to the channel portion is completely prevented.

Similarly, the buried stressor SiGe layers 401, 402 have their sides and bottoms covered with the silicon nitride film liners 141, 142, so that even if a crystal defect such as dislocation is generated due to the stress, it is completely prevented from propagating into the substrate or into the channel portion.

In addition, the channel stress is made to be insusceptible to the formation of electrical contacts to be established later, because the stressor layers 401, 402 are completely buried in the substrate. Of course, an insulating film having the internal stress may further be deposited thereon to add stress.

Furthermore, because the buried stressor SiGe layers 401, 402 are already isolated by the liner layers, it is not necessary to envelope the buried stressor SiGe layers 401, 402 with deep p-n junctions to suppress the leakage current. Therefore, the short channel effect is avoided.

In addition, the oxide films 121, 122 under the source/drain monocrystalline silicon electrodes 331, 332 reduce electric capacitive couplings between the source/drain electrodes and the substrate, thus allowing a high-speed operation of the MOSFET.

Moreover, extension of the source/drain electrodes over the isolation regions enables high-density packing of the devices. Of course, the source/drain electrodes extending over the isolation regions can be utilized as local interconnection lines.

Figure 10:
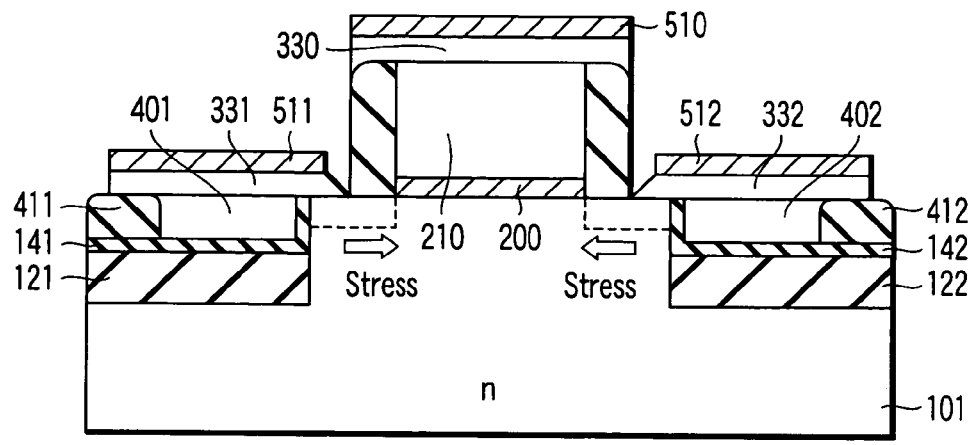

As a next processing step, after forming the structure in FIG. 9, it is oxidized as shown in FIG. 10. Since the oxidation speed of the buried stressor SiGe layers 401, 402 is much faster than that of a Si layer, the oxidation proceeds mainly at ends of the buried stressor SiGe layers 401, 402, forming the edge oxide film layers (i.e., sealing insulating layers) 411, 412. In addition, during the oxidation, the Ge atoms tend to be segregated from the resulting oxide layers into the SiGe layers 401, 402, further increasing the Ge concentration in the remaining SiGe layers. As a result, with the increased Ge concentration as well as the volumetric expansion of the resulting oxide film layers 411, 412, the channel portion comes to be compressed still further. Moreover, the resulting oxide film layers 411, 412 are connected to the oxide films 121, 122 via the silicon nitride film liners 141, 142, and thus, also function as part of the isolation regions.

After the oxide films formed on the source/drain monocrystalline silicon electrodes 331, 332 are removed by quick dipping in the HF solution, for example, Ni is sputtered on them. Subsequent rapid thermal annealing (RTA), for example, in nitrogen promotes silicidation reaction between Ni and Si to form NiSi layers 510, 511 and 512 on the gate and source/drain electrodes respectively. Here, the thickness of Ni should be adjusted so that a silicidation reaction stops within the silicon layers 330, 331, 332 and does not consume the buried stressor SiGe layers 401, 402 below. The silicon layers 330, 331, 332 may be completely consumed during the silicidation to turn into NiSi layers or lower parts of them can be retained as is.

Finally, unreacted Ni is removed by immersing it in, for example, the mixed solution of sulphuric acid and the hydrogen peroxide solution, thereby realizing a SALICIDE structure as shown in FIG. 10. Of course, prior to the silicidation process, a second gate sidewall may be formed if necessary to adjust a distance between the gate electrode and the resulting silicide layer.

Here, attention should be paid to the fact that formation of the oxide film layers (sealing insulating layers) 411, 412 enables fine-tuning of the stress to be applied to the channel. It is additionally noted that since the buried stressor SiGe layers 401, 402 are completely sealed off from the environment by the oxide film layers 411, 412 and the source/drain monocrystalline silicon electrodes 331, 332, the buried stressor SiGe layers will not be eroded even when the unreacted Ni is removed by wet etching with the mixture of sulphuric acid and the hydrogen peroxide solution, which will otherwise easily etch off the buried stressor SiGe layers.

Furthermore, because the silicidation reaction is restricted within the silicon layers 330, 331, 332 and the buried stressor SiGe layers 401, 402 are spared from the reaction, the resulting silicide layers 510, 511 and 512 can maintain flat bottoms. Therefore, stochastic emergence of spike-shaped deep protrusion of the silicide layers and associated severe junction leakage is prevented. In addition, the even and uniform silicide layers are free from agglomeration into disconnected patches and accompanying increase in electrical resistance and, thus, a low resistance of source/drain electrodes can be maintained.

Especially, it is also important that lateral epitaxial growth of the uniform amorphous silicon layer obtained by the CVD method is utilized to realize monocrystalline elevated source/drain electrodes 331, 332 with uniform thickness. With the unique and uniform thickness, it is easy to precisely contain the silicide layers within the silicon layers during the silicidation reaction.

In addition, the silicide layers 510, 511 and 512 are disposed above the channel surface and at a distanced from the channel region. Thus, a stress-relaxing influence of the silicidation on the channel stress is substantially abated. Consequently, without losing the channel stress, the lower resistance of the source/drain electrodes can be realized while improving the channel mobility.

As final steps for the device manufacturing, an insulating interlayer film is deposited and electrical contacts through the interlayer to the respective electrodes are established by making use of known techniques. Subsequently, metal-wiring and chip-mounting steps follow, thus completing a semiconductor device. In this manner, an ultra-high-speed micro elevated source/drain structure p-MOSFET is realized in which drawbacks of prior art are eliminated, both the short channel effect and the junction leakage are suppressed, the resistance is reduced in the source/drain electrode, the mobility is increased by the stress imposed on the channel portion, and the electric capacitive couplings between the source/drain electrodes and the substrate is reduced.

Although only one p-MOSFET is shown in the embodiment described above, obviously this method can be applied to a plurality of p-MOSFETs.

Furthermore, SiGe is used and described as the buried stressor layer, but it is obvious that any crystalline substance such as $Dy_2O_3$ or $La_2O_3$ having an original lattice constant different from that of Si crystal can be used as the buried stressor in the method shown in the present embodiment. The buried stressor may not be conductive either.

Moreover, the buried stressor does not necessarily have to be a single crystal. It may be a eutectic such as SiGe or may be a polycrystal. Further, it is also possible to use a substance which generates stress by changing its structure with external stimulation such as the thermal treatment. For example, $NiSi_2$ or $CoSi_2$ and its volumetric change associated with the silicidation reaction can be utilized as a source of the stress generation. In addition, it is also possible to employ, as the buried stressor, a substance such as a silicon nitride film which develops internal stress during a deposition step.

In a case of an n-MOSFET, unlike p-MOSFET, the mobility is known to be improved by applying tensile stress to the channel portion (refer to H. Irie et al., IEDM Tech. Dig. pp. 225 to 228, 2004 mentioned above). Therefore, it explicitly stated here that, making use of a eutectic of Si and C, which have a lattice constant smaller than that of Si, or utilizing a crystalline metal oxide such as $Pr_2O_3$ or $CeO_2$, which also have lattice constants smaller than that of Si, the method of the present embodiment can be applied to the n-MOSFET as well.

Of course, the present embodiment can be applied so that different kinds of buried stressor are formed for a plurality of n-MOSFETs and a plurality of p-MOSFETs to improve their mobility independently.

It is further added that a surface orientation of the Si semiconductor substrate is not limited to (100). Also the source/drain silicon electrodes need not to be completely monocrystalline either. It could be polycrystalline as long as the crystallinity of the Si semiconductor substrate is retained in an adjacent potion to the gate electrode.

Second Embodiment

Next, a second embodiment will be described which has a similar configuration to that of FIG. 1 described above, yet is easier to manufacture. While a final configuration of the second embodiment is shown in FIG. 16, it is different from that in FIG. 1 in that the isolation layers 121, 122 are not present while thin liner films 171, 172 serve as the sole bottom insulator of the source/drain electrodes from the substrate. Instead, additional isolation films 151, 152 disposed away from the gate electrode supplement the device isolation function. A manufacturing method thereof will be described referring to FIGS. 11 to 16.

Figure 11:
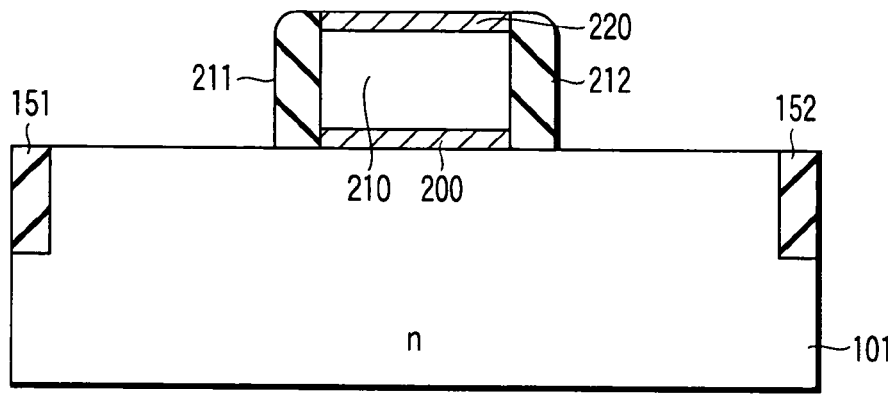

As shown in FIG. 11, first, the silicon oxide films 151, 152, for example, are formed as isolation insulating films 101 making use of known techniques such as a lithographic process, an RIE method and a CMP method to completely fill up shallow trenches etched on a silicon semiconductor substrate. Further, for example, a gate insulating film 200 made of a nitrided silicon oxide film, a gate electrode 210 made of polysilicon, gate sidewalls 211, 212 made of silicon nitride films, and an insulating film 220 made of a silicon nitride film on the gate electrode are formed by an effective method of known techniques such as a thermal nitridation method, the CVD method and the RIE method. Moreover, n-type conductive impurities have been introduced into the silicon semiconductor substrate. Thus, a structure shown in FIG. 11 is formed.

Figure 12:
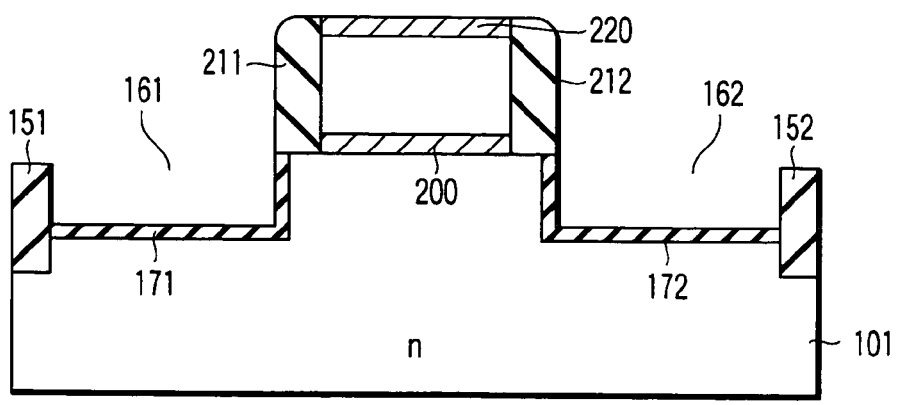

Next, as shown in FIG. 12, the silicon substrate is RIE-etched using a gate structure and the isolation insulating films 151, 152 as masks. Shallow trenches 161, 162 are formed where source/drain electrodes are to be constructed. Further, carbon atoms are ion-implanted at oblique angles to the bottoms and sides of the shallow trenches 161, 162, and carbon-containing silicon layers are formed on the interior surfaces of the trenches. By adjusting the implantation energy to 1 KeV or less, thickness of the carbon-containing silicon layers remain at several nanometers. A carbon concentration in the carbon-containing silicon layers should be 1 atomic percent or more. Of course, the carbon atoms can be implanted vertically or only from one tilted direction. In this case, the sides of the both trenches or one trench's side will remain carbon-free and be spared from the formation of the carbon-containing silicon layer. Here, it should be also emphasized that these trenches 161, 162, in which the stressor will be embedded later, have been made in a self-aligned manner without any lithography by RIE-etching the substrate while using the gate structure and the isolation insulating films as the etching masks. Subsequently, the carbon-containing silicon layer is thermally oxidized. As also disclosed in U.S. Pat. No. 6,051, 509, resultant carbon-containing oxide film are resistant against etching in the HF solution. Thus, the HF-resistive carbon-containing liner insulating films 171, 172 are formed at the bottoms and sides of the shallow trenches 161, 162 also in a self-aligned manner.

Figure 13:
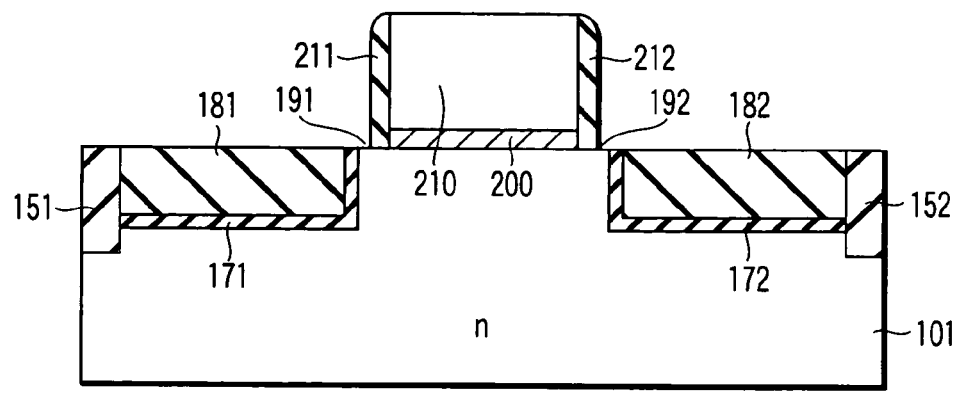

Then, as shown in FIG. 13, for example, boron-doped silicon oxide (Boron-Silicate Glass, BSG) films 181, 182 are formed as sacrificial insulating layers in such a manner as to completely fill up the shallow trenches 161, 162 by use of known techniques such as the CVD method and the CMP method. Further, by an effective method of the known technique, for example, by wet-etching with a heated phosphoric acid solution, the gate sidewalls 211, 212 are partially etched to expose silicon surfaces 191, 192 at both sides of the gate electrode. At the same time, the wet-etching removes the gate cap silicon nitride film 220 as well, thereby realizing a structure shown in FIG. 13.

Figure 14:
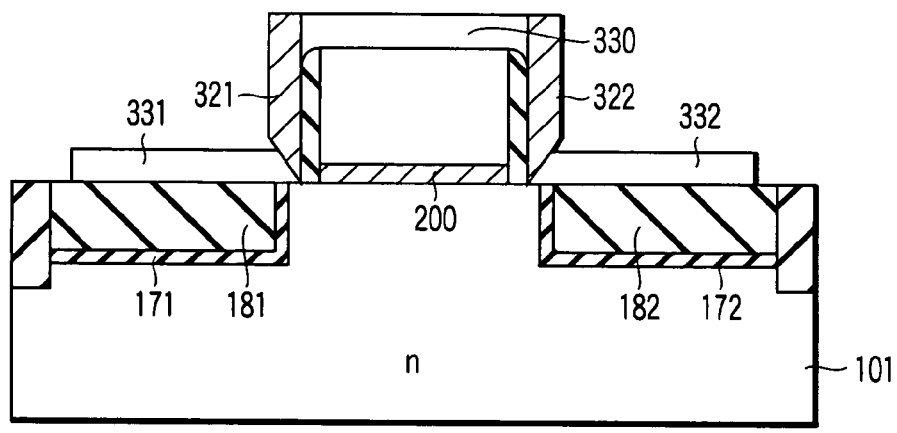

It should be mentioned here that the etching rate of the BSG films (181, 182) in a HF solution is extremely higher than that of the ordinary silicon oxide films. Since the bottoms of the BSG films 181, 182 are lined with the HF-resistant insulating films 171, 172 and their sides are boarded by the ordinary silicon oxide films 151, 152, the BSG films 181, 182 alone can be removed highly selectively by the HF solution while their surroundings stay intact Then, by repeating steps explained in FIGS. 6 and 7 of the first embodiment, oxide films 321, 322 on the sidewalls, a polycrystalline silicon layer 330 on the gate electrode, and monocrystalline silicon source/drain electrodes 331, 332 are formed, as shown in FIG. 14.

Figure 15:
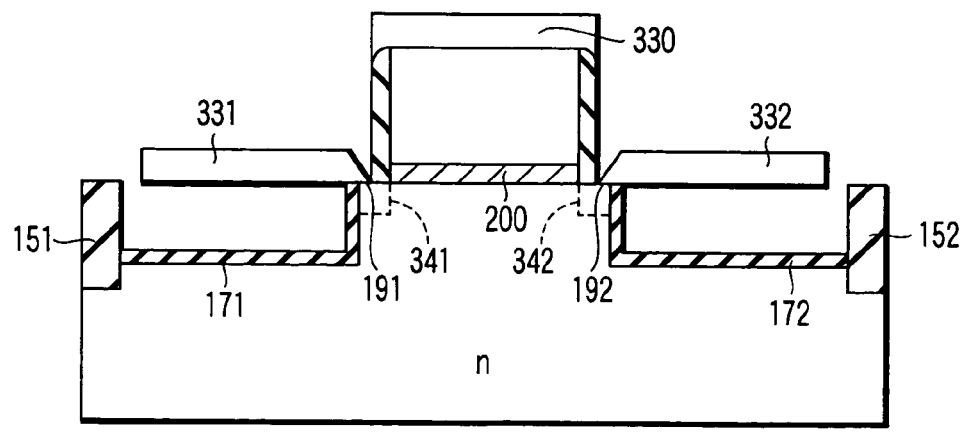

Subsequently, dipping in the HF solution removes the oxide films 321, 322 on the gate sidewalls as well as the BSG films 181, 182. Of course, the HF-resistant insulating films 171, 172 remain. Moreover, taking advantage of the much faster etching rate of the BSG films compared with the ordinary silicon oxide films, etching time can be adjusted so that the isolation silicon oxide films 151, 152 is retained. As a result, a structure as shown in FIG. 15 is realized in which the source/drain monocrystalline silicon electrodes 331, 332 are partially suspended in midair extending like wings at the both sides of the gate electrode. Of course, the polycrystalline silicon layer 330 is also formed on the gate electrode. Here, it should be noted that the monocrystalline silicon electrodes 331, 332 have direct contacts to a channel portion at the silicon surfaces 191, 192. As has previously been done, p-type impurities can be introduced into the monocrystalline silicon electrodes 331, 332 using a known technique such as the ion implantation. By ensuing thermal annealing, the impurities can be made to diffuse from the monocrystalline silicon electrodes through the silicon surfaces 191, 192 into the silicon substrate, so that source/drain extensions 341, 342 can be formed at both sides of the gate electrode.

Subsequently, steps explained in FIGS. 9 and 10 of the first embodiment are repeated, and SiGe stressor layers 401, 402 are formed under the wing-shaped source/drain monocrystalline silicon electrodes 331, 332. The following thermal oxidation produces oxide film layers (sealing insulating layers) 411, 412. Finally, the silicidation process produces NiSi layers 510, 511 and 512 on the gate and source/drain electrodes. Thus a structure as shown in FIG. 16 is realized.

It should be also noted that, since the buried stressor SiGe layers 401, 402 are disposed directly adjacent to the channel portion, their stress can be effectively applied to the channel portion.

Furthermore, since the buried stressor SiGe layers 401, 402 have their sides and bottoms covered with the insulating films 171, 172, a leakage current to the substrate or to the channel portion is completely prevented.

Similarly, the buried stressor SiGe layers 401, 402 have their sides and bottoms covered with the insulating films 171, 172, so that even if a crystal defect such as dislocation is generated due to the stress, it is completely prevented from propagating into the substrate or into the channel portion.

In addition, the channel stress is made to be insusceptible to the formation of electrical contacts to be established later, because the stressor layers 401, 402 are completely buried in the substrate. Of course, an insulating film having the internal stress may further be deposited thereon to add stress.

Furthermore, because the buried stressor SiGe layers 401, 402 are already isolated by the insulating films 171, 172, it is not necessary to envelope the buried stressor SiGe layers 401, 402 with deep p-n junctions to suppress the leakage current. Therefore, the short channel effect is avoided.

Moreover, attention should be paid to the fact that formation of the oxide film layers (sealing insulating layers) 411, 412 enables fine-tuning of the stress to be applied to the channel.

It is additionally noted here that since the buried stressor SiGe layers 401, 402 are completely sealed off from the environment by the oxide film layers 411, 412 and the source/drain monocrystalline silicon electrodes 331, 332, the buried stressor SiGe layers will not be eroded even when the unreacted Ni is removed by wet etching with the mixture of sulphuric acid and the hydrogen peroxide solution, which will otherwise easily etch off the buried stressor SiGe layers.

Furthermore, because the silicidation reaction is restricted within the silicon layers 330, 331, 332 and the buried stressor SiGe layers 401, 402 are spared from the reaction, the resulting silicide layers 510, 511 and 512 can maintain flat bottoms. Therefore, stochastic emergence of spike-shaped deep protrusion of the silicide layers and associated severe junction leakage is prevented. In addition, the even and uniform silicide layers are free from agglomeration into disconnected patches and accompanying increase in electrical resistance and, thus, a low resistance of source/drain electrodes can be maintained.

Especially, it is also important that lateral epitaxial growth of the uniform amorphous silicon layer obtained by the CVD method is utilized to realize monocrystalline elevated source/drain electrodes 331, 332 with uniform thickness. With the unique and uniform thickness, it is easy to precisely contain the silicide layers within the silicon layers during the silicidation reaction.

In addition, the silicide layers 510, 511 and 512 are disposed above the channel surface and at a distanced from the channel region. Thus, a stress-relaxing influence of the silicidation on the channel stress is substantially abated. Consequently, without losing the channel stress, the lower resistance of the source/drain electrodes can be realized while improving the channel mobility.

As final steps for the device manufacturing, an insulating interlayer film is deposited and electrical contacts through the interlayer to the respective electrodes are established by making use of known techniques. Subsequently, metal-wiring and chip-mounting steps follow, thus completing a semiconductor device.

A MOSFET formed as described above has effects similar to those in the first embodiment, and similar modifications can be made.

Third Embodiment

A third embodiment provides a method of manufacturing a semiconductor device, which is equipped with a buried oxide (BOX) on a substrate and an extremely thin monocrystalline semiconductor layer (so-called silicon-on-insulator (SOI)) thereon, which acts as the channel portion of the MOSFET. By embedding stressor layers in the BOX, stress is applied effectively to the SOI layer, and carrier mobility is improved. Moreover, a recess where the stressor is to be formed can be produced in a self-aligned manner relative to a gate electrode. In addition, a simple manufacturing process of SALICIDED elevated source/drain MOSFET structure is provided in which low-resistance source/drain electrodes are maintained thanks to even and uniform silicide layers obtained by silicidizing only silicon layers.

Figure 22:
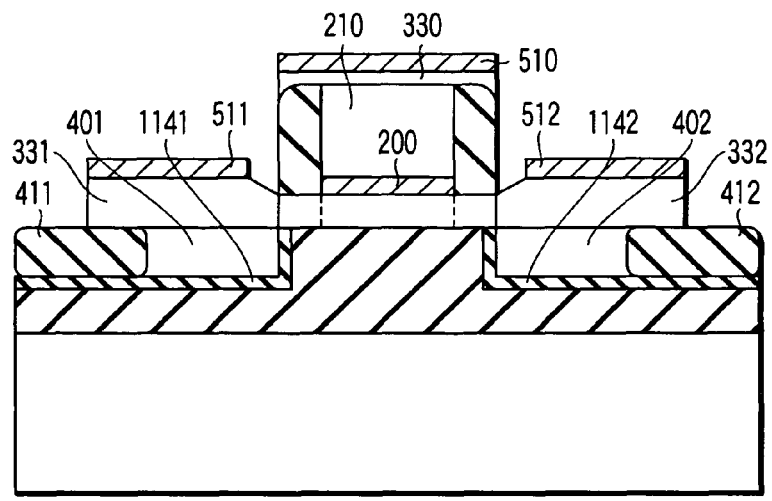

A basic configuration is similar to that in FIG. 1, but a final configuration of the third embodiment is as shown in FIG. 22 because an SOI substrate is used. A manufacturing method thereof will be sequentially described below.

FIG. 17 shows the SOI substrate used in the present embodiment. This SOI substrate is manufactured by a known technique, and comprises a silicon semiconductor substrate 101, a BOX silicon oxide film 1000 formed thereon, and a monocrystalline silicon semiconductor layer 1100 further formed thereon.

First, as has been shown in FIG. 5, for example, a gate insulating film 200, for example, a nitrided silicon oxide film, a gate electrode 210, for example, polysilicon, and gate sidewalls 211, 212, for example, silicon nitride films are formed by effective methods of known techniques such as a thermal nitridation method, a CVD method and an RIE method.

Next, using such a gate structure as a mask, the silicon semiconductor substrate 1100 is etched away by the RIE or the like. Further etching down into the BOX layer creates a channel region 1110 and shallow trenches 1111, 1112 as shown in FIG. 18. The n-type conductive impurities may have been introduced into the channel region 1110 prior to the etching process. It should be noted here that these recesses in which stressor layers will be buried later have been formed in a self-aligned manner using the gate structure as the mask.

Figure 19:
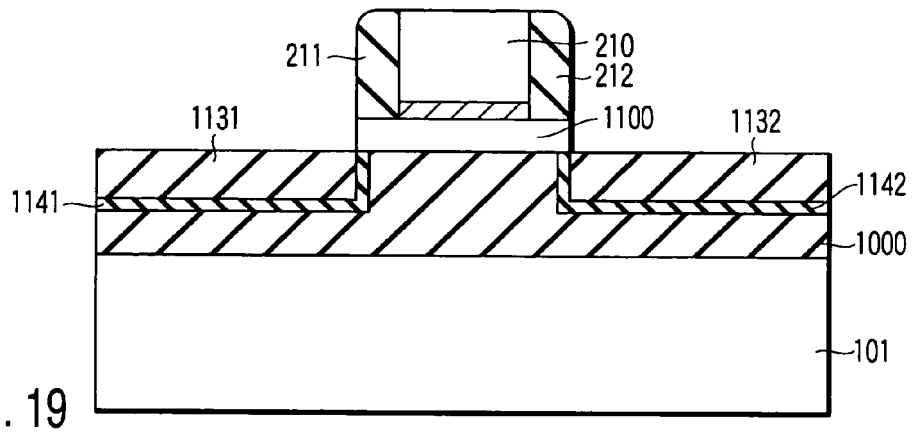

Next, over such a structure, HF-resistant insulating films, for example, silicon nitride films 1141, 1142 are deposited as liners. Further, for example, silicon oxide films 1131, 1132 are formed to completely fill up the shallow trenches 1111, 1112, as sacrificial insulating layers, by known techniques such as the CVD method and a CMP method. It should be noted here that, at the bottoms and sides, the silicon oxide films 1131, 1132, are lined with the HF-resistant silicon nitride film liners 1141, 1142. Thus, a structure shown in FIG. 19 is realized.

Figure 20:
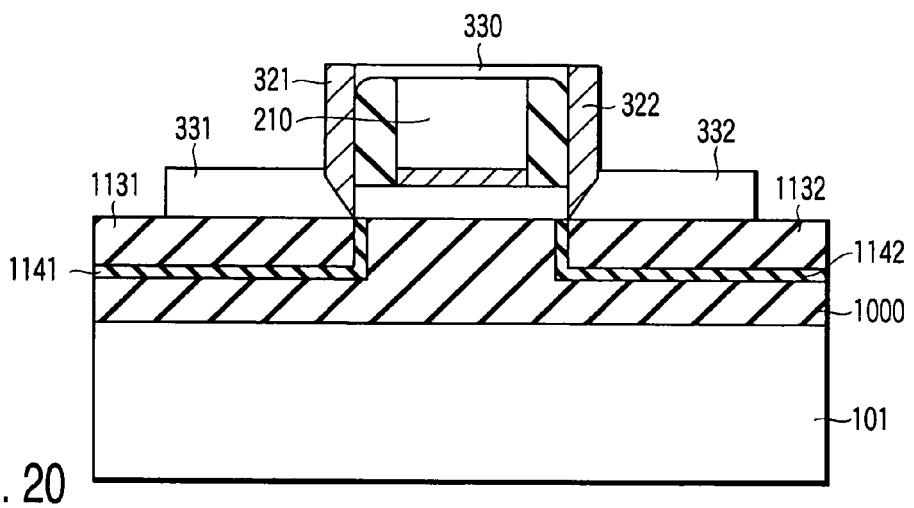

Then, by repeating steps explained in FIGS. 6 and 7 of the first embodiment, oxide films 321, 322 on the sidewalls, a polycrystalline silicon layer 330 on the gate electrode, and monocrystalline silicon source/drain electrodes 331, 332 are formed, as shown in FIG. 20.

The thickness of the monocrystalline silicon electrodes 331, 332 is better to be made larger than the thickness of the thin SOI layer. Thicker source/drain electrodes are effective to reduce electrical resistances of these portions, which are otherwise of high resistance due to the small thickness of the SOI layers.

Of course, selective epitaxial growth may have been utilized to form thick source/drain electrodes on such a thin SOI layer. Nonetheless, for selective epitaxial growth, a high-temperature processing is required to assure the selectivity. Unfortunately, however, under such a high temperature, very thin SOI layers, which are thermodynamically unstable in nature, will be easily deformed and possibly agglomerates into numerous small isolated islands, completely losing their conductivity.

On the contrary, in the present embodiment, an amorphous silicon layer is first deposited at a low temperature by the CVD, so that any deformation of the SOI layers is avoided. Associated increase in the silicon layer's thickness drastically improves its thermal stability and, thus, liberates the following manufacturing steps from severe process constraints on the allowable thermal treatments otherwise imposed by the thermal instability of the thin SOI layers.

Figure 21:
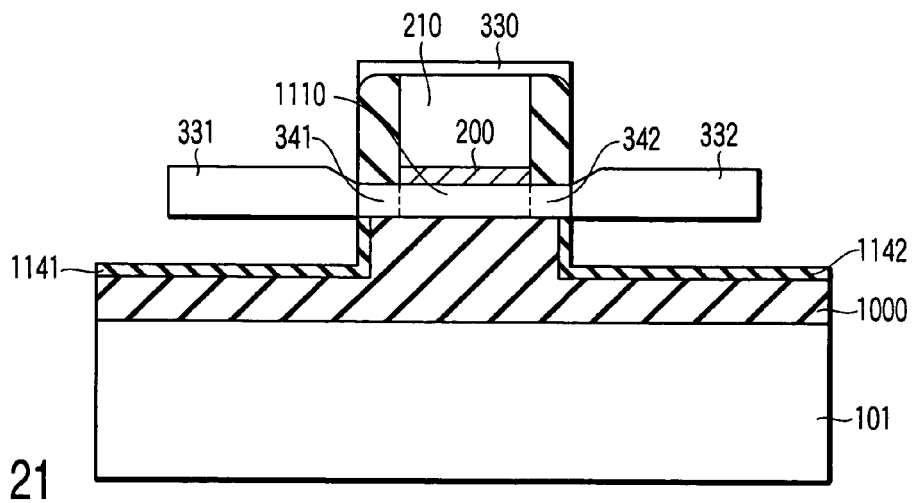

Subsequently, the resultant structure is dipped in the HF solution. Thus, the silicon oxide films 321, 322 on the gate sidewalls and the sacrificial silicon oxide films 1131, 1132 are removed. On the other hand, the BOX silicon oxide film 1000 with its exterior protected by the HF-resistant silicon nitride film liners 1141, 1142 remains. As a result, a structure as shown in FIG. 21 is realized in which the source/drain monocrystalline silicon electrodes 331, 332 are suspended in midair extending like wings at the both sides of the gate electrode. Here, it should be noted that the monocrystalline silicon electrodes 331, 332 have direct contacts to a channel portion 1100 through channel side surfaces. Of course, the polycrystalline silicon layer 330 is also formed on the gate electrode.

As has previously been done, p-type impurities can be introduced into the monocrystalline silicon electrodes 331, 332 using a known technique such as the ion implantation. By ensuing thermal annealing, the impurities can be made to diffuse from the monocrystalline silicon electrodes into the silicon substrate, so that source/drain extensions 341, 342 can be formed at both sides of the gate electrode.

Subsequently, steps explained in FIGS. 9 and 10 of the first embodiment are repeated, and SiGe stressor layers 401, 402 are formed under the wing-shaped source/drain monocrystalline silicon electrodes 331, 332. The following thermal oxidation produces oxide film layers (sealing insulating layers) 411, 412. Finally, the silicidation process produces NiSi layers 510, 511 and 512 on the gate and source/drain electrodes. Thus a structure as shown in FIG. 22 is realized.

It should be also noted that, since the buried stressor SiGe layers 401, 402 are disposed directly adjacent to the channel portion, their stress can be effectively applied to the channel portion.

Furthermore, since the buried stressor SiGe layers 401, 402 have their sides and bottoms covered with the insulating films 1141, 1142, a leakage current to the channel portion is completely prevented. Similarly, the buried stressor SiGe layers 401, 402 have their sides and bottoms covered with the insulating films, so that even if a crystal defect such as dislocation is generated due to the stress, it is completely prevented from propagating into the channel portion.

In addition, the channel stress is made to be insusceptible to the formation of electrical contacts to be established later, because the stressor layers 401, 402 are completely buried in the substrate. Of course, an insulating film having the internal stress may further be deposited thereon to add stress.

Furthermore, since the shallow source/drain extensions 341, 342 have been formed and it is not necessary to envelope the buried stressor SiGe layers 401, 402 with deep p-n junctions, the short channel effect is suppressed.

Moreover, attention should be paid to the fact that formation of the oxide film layers (sealing insulating layers) 411, 412 enables fine-tuning of the stress to be applied to the channel.

It is additionally noted here that since the buried stressor SiGe layers 401, 402 are completely sealed off from the environment by the oxide film layers 411, 412 and the source/drain monocrystalline silicon electrodes 331, 332, the buried stressor SiGe layers will not be eroded even when the unreacted Ni is removed by wet etching with the mixture of sulphuric acid and the hydrogen peroxide solution, which will otherwise easily etch off the buried stressor SiGe layers.

Furthermore, because the silicidation reaction is restricted within the silicon layers 330, 331, 332 and the buried stressor SiGe layers 401, 402 are spared from the reaction, the resulting silicide layers 510, 511 and 512 can maintain flat bottoms. Therefore, the even and uniform silicide layers are free from agglomeration into disconnected patches and accompanying increase in electrical resistance and, thus, a low resistance of source/drain electrodes can be maintained.

Especially, it is also important that lateral epitaxial growth of the uniform amorphous silicon layer obtained by the CVD method is utilized to realize monocrystalline elevated source/drain electrodes 331, 332 with uniform thickness. With the unique and uniform thickness, it is easy to precisely contain the silicide layers within the silicon layers during the silicidation reaction.

In addition, the thickness of the source/drain electrodes is increased by depositing an amorphous silicon layer at a low temperature with the CVD. Therefore, it is possible to avoid any deformation of the SOI layers, which is otherwise inevitable in conventional selective epitaxial growth on very thin SOI layers.

Moreover, the silicide layers 510, 511 and 512 are disposed above the channel surface and at a distanced from the channel region. Thus, a stress-relaxing influence of the silicidation on the channel stress is substantially abated. Consequently, without losing the channel stress, the lower resistance of the source/drain electrodes can be realized while improving the channel mobility.

As final steps for the device manufacturing, an insulating interlayer film is deposited and electrical contacts through the interlayer to the respective electrodes are established by making use of known techniques. Subsequently, metal-wiring and chip-mounting steps follow, thus completing a semiconductor device.

In this manner, an ultra-high-speed micro elevated source/drain structure p-type SOI-MOSFET is realized. In this MOSFET, drawbacks of prior art are eliminated, both the short channel effect and the junction leakage current are suppressed, the resistance is reduced in the source/drain electrode, the mobility is increased by the stress imposed on the channel portion, and recesses for the stressor layers can be formed in a self-aligned manner.

The MOSFET formed as described above enjoys a thin channel layer by an SOI technique and has effects similar to those of the MOSFET in the first embodiment, and similar modifications can be made.

Fourth Embodiment

In a MOSFET of a fourth embodiment, by embedding stressor layers in a BOX, stress is effectively applied to the SOI layer, and carrier mobility is improved. Moreover, a recess where the stressor is to be formed can be produced in a simple and easy manner. In addition, a simple manufacturing process of SALICIDED elevated source/drain MOSFET structure is provided in which low-resistance source/drain electrodes are maintained thanks to even and uniform silicide layers obtained by silicidizing only silicon layers.

Figure 23:
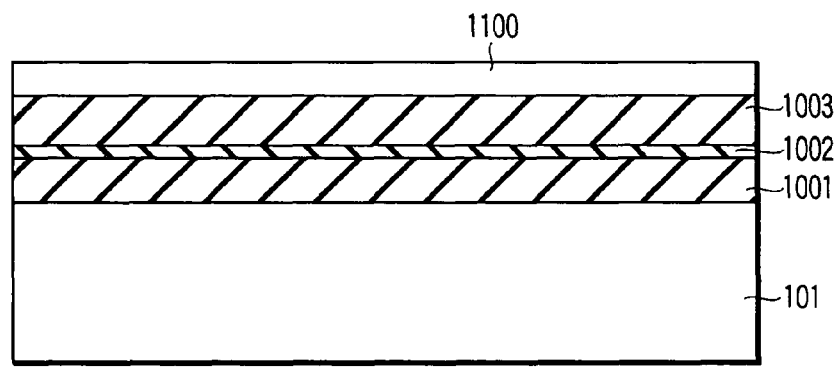
FIGS. 23 to 27 are sectional views for stepwise explanation of a process of manufacturing a MOSFET according to a fourth embodiment.
Figure 27:
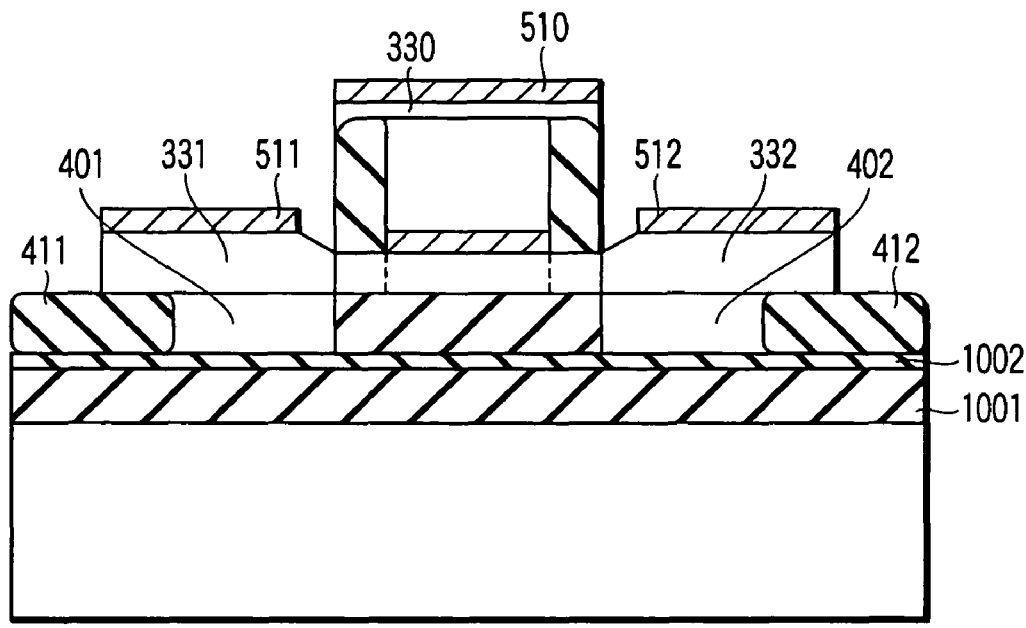
Figure 28:
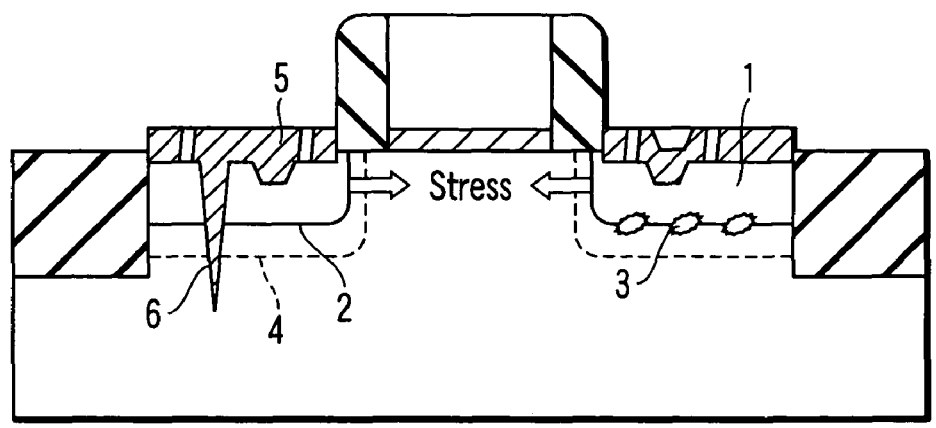
FIG. 28 is a sectional view for explanation of problems of a conventional MOSFET.

A basic configuration of the MOSFET in the fourth embodiment is similar to that in FIG. 1, but a final configuration is as shown in FIG. 27 because an SOI substrate is used. In the fourth embodiment, the SOI substrate as shown in FIG. 23 is used. The SOI substrate is comprised of a silicon semiconductor substrate 101; a three-layered insulating structure formed thereon, for example, a first BOX silicon oxide film 1001, a silicon nitride film liner 1002 formed thereon as a HF-resistive insulator, and a second BOX silicon oxide film 1003 over them; and a monocrystalline silicon semiconductor layer 1100 further formed thereon. Such an SOI substrate can be realized by stacking the insulating films as described above over an ordinary silicon substrate, then bonding a second monocrystalline silicon substrate to the surface of the insulator complex, and polishing and thinning the upper silicon substrate by effective methods of known techniques.

First, as has been shown in FIG. 5, for example, a gate insulating film 200, for example, a nitrided silicon oxide film, a gate electrode 210, for example, polysilicon, and gate sidewalls 211, 212, for example, silicon nitride films are formed by effective methods of known techniques such as a thermal nitridation method, a CVD method and an RIE method.

Figure 24:
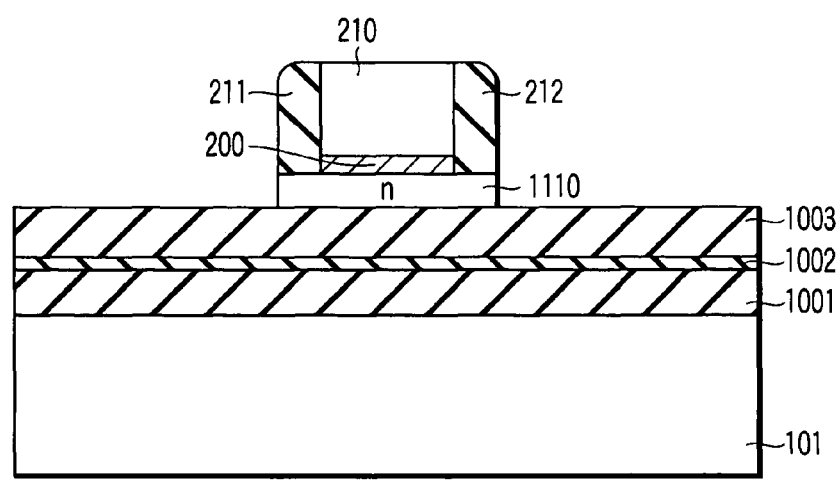

Next, using such a gate structure as a mask, the silicon semiconductor substrate 1100 is etched away by the RIE or the like, creating a channel region, as shown in FIG. 24. The n-type conductive impurities may have been introduced into the channel region 1110 prior to the etching process. It should be noted here that the channel region has been formed in a self-aligned manner using the gate structure as the mask.

Figure 25:
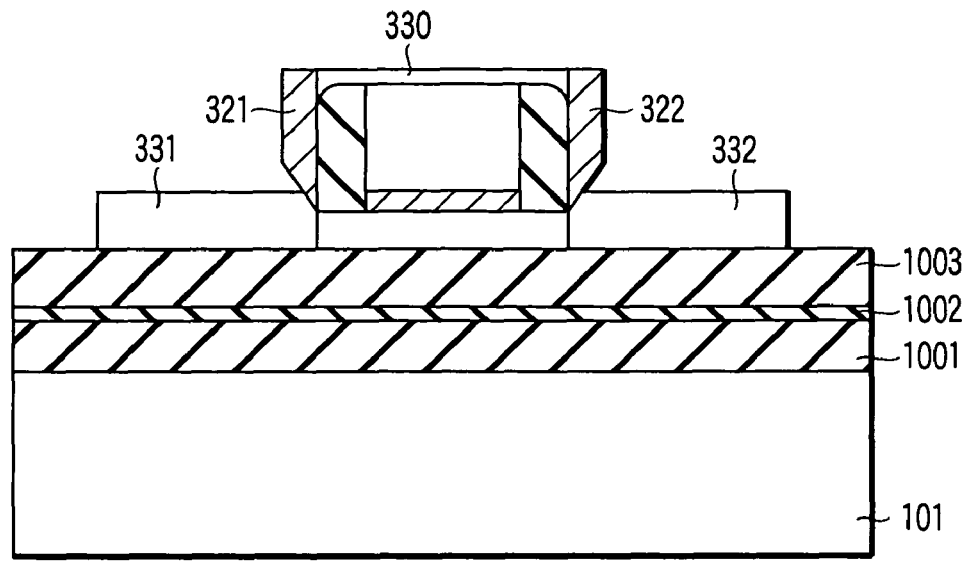

Then, by repeating steps explained in FIGS. 6 and 7 of the first embodiment, oxide films 321, 322 on the sidewalls, a polycrystalline silicon layer 330 on the gate electrode, and monocrystalline silicon source/drain electrodes 331, 332 are formed, as shown in FIG. 25.

Here, the thickness of the monocrystalline silicon electrodes 331, 332 is better to be made larger than the thickness of the thin SOI layer, because thicker source/drain electrodes are effective to reduce electrical resistances of these portions in comparison with the thin channel SOI layer. Here it should be mentioned that, in the present embodiment, a uniform amorphous silicon layer is first deposited at a low temperature by the CVD, so that any deformation of the thin SOI layer is avoided unlike a high-temperature selective epitaxial growth.

Figure 26:
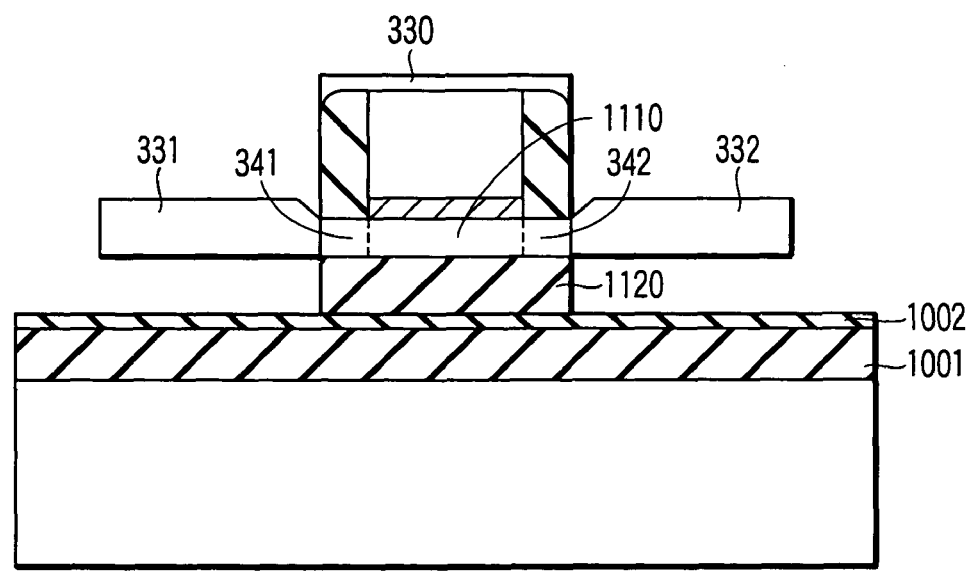

Subsequently, the resultant structure is dipped in the HF solution. Thus, the silicon oxide films 321, 322 on the gate are removed, as shown in FIG. 26. At the same time, the second BOX silicon oxide film 1003 is also etched from the exposed surfaces at the ends of the monocrystalline silicon electrodes 331, 332 and starts to recede sideways under the monocrystalline silicon electrodes. Here, the etching time in the HF solution is adjusted so that the recession stops halfway and a part 1120 of the second BOX silicon oxide film remains under the channel portion 1110. Of course, the first BOX silicon oxide film 1001 with its upper surface protected by the HF-resistant silicon nitride film liner 1002 remains. As a result, a structure as shown in FIG. 26 is realized in which the source/drain monocrystalline silicon electrodes 331, 332 are suspended in midair extending like wings at the both sides of the gate electrode. Here, it should be noted that the monocrystalline silicon electrodes 331, 332 have direct contacts to a channel portion 1110 through channel side surfaces. Naturally, the polycrystalline silicon layer 330 is also formed on the gate electrode.

As has previously been done, p-type impurities can be introduced into the monocrystalline silicon electrodes 331, 332 using a known technique such as the ion implantation. By ensuing thermal annealing, the impurities can be made to diffuse from the monocrystalline silicon electrodes into the silicon substrate, so that source/drain extensions 341, 342 can be formed at both sides of the gate electrode.

It should be noted here that, unlike previous embodiments, no material filling step is required prior to the realization of the above structure, thanks to the prefabricated three-layered insulating films on the silicon substrate. Because the material filling steps are dispensed with, the manufacturing cost can be reduced.

Subsequently, steps explained in FIGS. 9 and 10 of the first embodiment are repeated, and SiGe stressor layers 401, 402 are formed under the wing-shaped source/drain monocrystalline silicon electrodes 331, 332. The following thermal oxidation produces oxide film layers (sealing insulating layers) 411, 412. Finally, the silicidation process produces NiSi layers 510, 511 and 512 on the gate and source/drain electrodes. Thus a structure as shown in FIG. 27 is realized.

It should be also noted that, since the buried stressor SiGe layers 401, 402 are disposed directly adjacent to the channel portion, their stress can be effectively applied to the channel portion.

Furthermore, since the buried stressor SiGe layers 401, 402 have their sides and bottoms covered with the insulating films, a leakage current to the channel portion is completely prevented.

Similarly, the buried stressor SiGe layers 401, 402 have their sides and bottoms covered with the insulating films, so that even if a crystal defect such as dislocation is generated due to the stress, it is completely prevented from propagating into the channel portion.

In addition, the channel stress is made to be insusceptible to the formation of electrical contacts to be established later, because the stressor layers 401, 402 are completely buried in the substrate. Of course, an insulating film having the internal stress may further be deposited thereon to add stress.

Furthermore, since the shallow source/drain extensions 341, 342 have been formed and it is not necessary to envelope the buried stressor SiGe layers 401, 402 with deep p-n junctions, the short channel effect is suppressed.

Moreover, attention should be paid to the fact that formation of the oxide film layers (sealing insulating layers) 411, 412 enables fine-tuning of the stress to be applied to the channel. It is additionally noted here that since the buried stressor SiGe layers 401, 402 are completely sealed off from the environment by the oxide film layers 411, 412 and the source/drain monocrystalline silicon electrodes 331, 332, the buried stressor SiGe layers will not be eroded even when the unreacted Ni is removed by wet etching with the mixture of sulphuric acid and the hydrogen peroxide solution, which will otherwise easily etch off the buried stressor SiGe layers.

Furthermore, because the silicidation reaction is restricted within the silicon layers 330, 331, 332 and the buried stressor SiGe layers 401, 402 are spared from the reaction, the resulting silicide layers 510, 511 and 512 can maintain flat bottoms. Therefore, the even and uniform silicide layers are free from agglomeration into disconnected patches and accompanying increase in electrical resistance and, thus, a low resistance of source/drain electrodes can be maintained.

Especially, it is also important that lateral epitaxial growth of the uniform amorphous silicon layer obtained by the CVD method is utilized to realize monocrystalline elevated source/drain electrodes 331, 332 with uniform thickness. With the unique and uniform thickness, it is easy to precisely contain the silicide layers within the silicon layers during the silicidation reaction.

In addition, the thickness of the source/drain electrodes is increased by depositing an amorphous silicon layer at a low temperature with the CVD. Therefore, it is possible to avoid any deformation of the SOI layers, which is otherwise inevitable in conventional selective epitaxial growth on very thin SOI layers.

Moreover, the silicide layers 510, 511 and 512 are disposed above the channel surface and at a distanced from the channel region. Thus, a stress-relaxing influence of the silicidation on the channel stress is substantially abated. Consequently, without losing the channel stress, the lower resistance of the source/drain electrodes can be realized while improving the channel mobility.

As final steps for the device manufacturing, an insulating interlayer film is deposited and electrical contacts through the interlayer to the respective electrodes are established by making use of known techniques. Subsequently, metal-wiring and chip-mounting steps follow, thus completing a semiconductor device.

In this manner, an ultra-high-speed micro elevated source/drain structure p-type SOI-MOSFET is realized. In this MOSFET, drawbacks of prior art are eliminated, both the short channel effect and the junction leakage current are suppressed, the resistance is reduced in the source/drain electrode, the mobility is increased by the stress imposed on the channel portion, and the extending the source/drain electrodes are formed without using the filling steps.

The MOSFET formed as described above enjoys the feature of a thin channel layer of the SOI substrate and has effects similar to those of the MOSFET in the first embodiment, and similar modifications can be made.

As described above in detail, the following effects can be expected according to the embodiments of the present invention.

(1) Since the stressor layers are disposed directly adjacent to the channel portion, their stress can be effectively applied to the channel portion. Therefore, the channel mobility can be efficiently improved.

(2) Since the buried stressor layers have their sides and bottoms covered with the insulating films, a leakage current to the substrate or to the channel portion is completely prevented.

(3) Since it is not necessary to envelope the buried stressor layers with deep p-n junctions to suppress the leakage current. Therefore, the short channel effect is avoided.

(4) The silicide layers are disposed above the channel surface and at a distanced from the channel region. Thus, a stress-relaxing influence of the silicidation on the channel stress is substantially abated. Consequently, without losing the channel stress, the lower resistance of the source/drain electrodes can be realized while improving the channel mobility.

(5) Because the silicidation reaction is restricted within the silicon layers and the buried stressor layers are spared from the reaction, the resulting silicide layers can maintain flat bottoms. Therefore, stochastic emergence of spike-shaped deep protrusion of the silicide layers and associated severe junction leakage is prevented. In addition, the even and uniform silicide layers are free from agglomeration into disconnected patches and accompanying increase in electrical resistance and, thus, a low resistance of source/drain electrodes can be maintained.

(6) The channel stress is made to be insusceptible to the formation of electrical contacts, because the stressor layers are completely buried in the substrate. Further, an insulating film having the internal stress may further be deposited thereon to add stress.

(7) By adjusting the composition of the stressor (i.e., by tailoring its lattice constant) to be grown epitaxially with reference to the upper crystalline silicon electrodes, the stress to be generated can be finely tuned.

(8) By forming oxide film layers (sealing insulating layers) at the ends of the buried stressor layers, fine-tuning of the stress to be applied to the channel is possible.

(9) The buried stressor layers have their sides and bottoms covered with the insulating films, so that even if a crystal defect such as dislocation is generated due to the stress, it is completely prevented from propagating into the substrate or into the channel portion.

(10) Since the buried stressor SiGe layers are completely sealed off from the environment by the oxide film layers and the source/drain monocrystalline silicon electrodes, the buried stressor SiGe layers will not be eroded even when the unreacted Ni is removed by wet etching with the mixture of sulphuric acid and the hydrogen peroxide solution.

(11) Since lateral epitaxial growth of the uniform amorphous silicon layer obtained by the CVD method is utilized to realize monocrystalline elevated source/drain electrodes with uniform thickness, it is easy to precisely contain the silicide layers within the silicon layers during the silicidation reaction.

(12) When using an SOI substrate, the thickness of the source/drain electrodes is increased by depositing an amorphous silicon layer at a low temperature with the CVD. Therefore, it is possible to avoid any deformation of the SOI layers, which is otherwise inevitable in conventional selective epitaxial growth on very thin SOI layers.

(13) The oxide films provided under the source/drain monocrystalline silicon electrodes reduce electric capacitive couplings between the source/drain electrodes and the substrate, thus allowing a high-speed operation of the MOSFET.

(14) Extension of the source/drain electrodes over the isolation regions enables high-density packing of the devices.

(15) The source/drain electrodes extending over the isolation regions can be further utilized as local interconnection lines.

(16) The recesses to embed the stressor layers can be formed by RIE-etching in a self-aligned manner using the gate structure as the mask without any lithography.

(17) The HF-resistant insulating films can be formed at the bottoms and sides of the recesses to embed the stressor layers in a self-aligned manner, by forming the carbon-containing silicon layers on the interior of the recesses using the gate structure as the mask and thermally oxidizing the carbon-containing silicon layers.

(18) When using an SOI substrate, by utilizing the prefabricated three-layered insulating films on the silicon substrate, no material filling step is specifically required prior to the realization of the structure in which the source/drain monocrystalline silicon electrodes are suspended in midair, extending like wings, at the both sides of the gate electrode. Because the material filling steps are dispensed with, the manufacturing cost can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a monocrystalline channel region of a first conductivity type formed on the surface of the semiconductor substrate;
a gate electrode formed on the channel region via a gate insulating film;
a pair of source/drain electrodes of a second conductivity type provided on both sides of the gate electrode and having a monocrystalline or polycrystalline structure;
metallic compound layers formed on the source/drain electrodes;
first and second stress application layers placed in direct contact with bottom surfaces of the source/drain electrodes, respectively, and each having a crystal structure whose intrinsic lattice spacing is different from lattice spacing inherent in a substance constituting the source/drain electrodes;
first and second buried insulating regions placed in direct contact with bottom surfaces of the first and second stress application layers, respectively;
sealing insulating layers provided at both far-side and near-side ends of the first and second stress application layers, respectively, with respect to the gate electrode; and
liner insulating layers insoluble in an HF solution and formed between the stress application layers and the buried insulating regions.

2. The semiconductor device according to claim 1, wherein the first and second buried insulating regions are in direct contact with the sealing insulating layers, respectively, and function as isolation insulating regions.

3. The semiconductor device according to claim 1, wherein the metallic compound layers are located higher than a surface of the channel region.

4. The semiconductor device according to claim 1, wherein each of the first and second stress application layers is a eutectic either of Si and Ge or of Si and C.

5. The semiconductor device according to claim 1, wherein each of the first and second stress application layers includes a metal oxide.

6. The semiconductor device according to claim 1, further comprising third buried insulating region formed under the channel region and between the stress application layers.

7. The semiconductor device according to claim 1, wherein the metallic compound layers include NiSi.

8. The semiconductor device according to claim 1, wherein the intrinsic lattice spacing of the stress application layers is larger than the lattice spacing of the source/drain electrodes when the second conductivity type of the source/drain electrodes is a p-type, while the intrinsic lattice spacing of the stress application layers is smaller than the lattice spacing of the source/drain electrodes when the second conductivity type of the source/drain electrodes is an n-type.

9. A semiconductor device comprising:
a semiconductor substrate;
a monocrystalline channel region of a first conductivity type formed on the surface of the semiconductor substrate;
a gate electrode formed on the channel region via a gate insulating film;
a pair of source/drain electrodes of a second conductivity type provided on both sides of the gate electrode and having a monocrystalline or polycrystalline structure;
metallic compound layers formed on the source/drain electrodes;
stress application layers placed in direct contact with bottom surfaces of the source/drain electrodes, respectively, and each having a crystal structure whose intrinsic lattice spacing is different from lattice spacing inherent in a substance constituting the source/drain electrodes;

buried insulating regions placed in direct contact with bottom surfaces of the stress application layers, respectively;

first sealing insulating layers provided at near-side ends of the stress application layers, respectively, with respect to the gate electrode; and liner insulating layers insoluble in an HF solution and formed between the stress application layers and the buried insulating regions.

10. The semiconductor device according to claim 9, further comprising second sealing insulating layers provided at far-side ends of the stress application layers, respectively, with respect to the gate electrode.

11. The semiconductor device according to claim 10, wherein the buried insulating regions are in direct contact with the second sealing insulating layers, respectively, and function as isolation insulating regions.

12. The semiconductor device according to claim 9, wherein the metallic compound layers are located higher than a surface of the channel region.

13. The semiconductor device according to claim 9, wherein each of the stress application layers is a eutectic either of Si and Ge or of Si and C.

14. The semiconductor device according to claim 9, wherein each of the stress application layers includes a metal oxide.

* * * * *